United States Patent [19]
Choi et al.

[11] Patent Number: 5,737,258
[45] Date of Patent: Apr. 7, 1998

[54] NONVOLATILE SEMICONDUCTOR MEMORY WHICH IS CONNECTABLE TO A DRAM BUS

[75] Inventors: Do-Chan Choi, Seoul; Woung-Moo Lee, Seongnam; Tae-Sung Jung, Gunpo; Syed Ali; Ejaz Haq, both of Seoul, all of Rep. of Korea

[73] Assignee: Samsung Electronics Co., Ltd., Suwon, Rep. of Korea

[21] Appl. No.: 638,100

[22] Filed: Apr. 26, 1996

[30] Foreign Application Priority Data

Apr. 26, 1995 [KR] Rep. of Korea .................. 1995-9972

[51] Int. Cl.$^6$ ........................................ G11C 5/02
[52] U.S. Cl. ............................... 365/63; 365/51
[58] Field of Search ............................. 365/51, 63

[56] References Cited

U.S. PATENT DOCUMENTS

| | | | |
|---|---|---|---|
| 5,089,993 | 2/1992 | Neal et al. | 365/63 |
| 5,161,124 | 11/1992 | Love | 365/51 X |
| 5,349,552 | 9/1994 | Zampaglione | 365/63 |
| 5,544,096 | 8/1996 | Takasugi | 365/63 X |

*Primary Examiner*—Son T. Dinh
*Attorney, Agent, or Firm*—Myers Bigel Sibley & Sajovec

[57] ABSTRACT

An electrically erasable and programmable nonvolatile memory device (EEPROM) such as a flash memory, is pin compatible with a dynamic random access memory device (DRAM), such that flash memory may be connected to a DRAM bus. Preferably, the flash memory is read and write timing-compatible with the DRAM read and write signals and is also preferably block read and block write timing compatible with DRAM block read and block write signals. The flash memory accepts signals to perform sleep and erase functions from signal lines of a DRAM bus which are not used by a DRAM. In order to perform a block erase, which is a characteristic of flash memory, the device preferably accepts an instruction to perform a block erase from signal lines of a DRAM bus which are not used by a DRAM and a block address for the block erase from the most significant bit address lines of the DRAM bus.

28 Claims, 11 Drawing Sheets

| | | | |
|---|---|---|---|
| NC | 1 | 56 | WP# |
| GND | 2 | 55 | WE# |
| NC | 3 | 54 | OE# |
| A9 | 4 | 53 | RY/BY# |
| A8 | 5 | 52 | DQ15 |
| A7 | 6 | 51 | DQ7 |
| A6 | 7 | 50 | DQ14 |
| A5 | 8 | 49 | DQ6 |
| Vcc | 9 | 48 | GND |
| RAS# | 10 | 47 | DQ13 |
| CAS# | 11 | 46 | DQ5 |
| NC | 12 | 45 | DQ12 |
| NC | 13 | 44 | DQ4 |
| GND | 14 | 43 | Vcc |
| Vpp | 15 | 42 | GND |
| RP# | 16 | 41 | DQ11 |
| NC | 17 | 40 | DQ3 |
| NC | 18 | 39 | DQ10 |
| NC | 19 | 38 | DQ2 |
| NC | 20 | 37 | Vcc |
| GND | 21 | 36 | DQ9 |
| NC | 22 | 35 | DQ1 |
| NC | 23 | 34 | DQ8 |
| A4 | 24 | 33 | DQ0 |
| A3 | 25 | 32 | NC |
| A2 | 26 | 31 | Vcc |
| A1 | 27 | 30 | NC |
| A0 | 28 | 29 | NC |

E28F016XD
56-LEAD TSOP PINOUT

*Fig. 1*

NONVOLATILE SEMICONDUCTOR MEMORY WHICH IS CONNECTABLE TO A DRAM BUS

FIELD OF THE INVENTION

The present invention relates to semiconductor memory devices, and more particularly to electrically erasable and programmable nonvolatile memories, hereinafter also referred to as EEPROMs, and methods of operating same.

BACKGROUND OF THE INVENTION

High-density EEPROMs are presently used in computer or microprocessor based systems. Moreover, hard disk drives, which are widely used in portable computers or laptop (notebook) computers, occupy a relatively large area in the small laptop housing. Thus, development efforts have focused on using high-density and high performance EEPROMs as a substitute for a hard disk drive, in order to reduce the area occupied by the hard disk.

In order to improve the density and performance of EEPROMs, attempts have been made to reduce the area occupied by the memory cells. Recently, techniques for reducing the area occupied by the memory cells have been developed for EEPROMs using NAND-structured memory cells, wherein the number of selection transistors for each cell and the number of bit line connections can be reduced. The NAND-structured memory cells generally include a p-type well area formed on an n-type semiconductor substrate. An erasing and programming technique for these devices is disclosed in a paper entitled "A NAND Structured Cell With a New Programming Technology for Highly Reliable 5V-Only Flash EEPROM" Kirisawa et al. on pages 129–130 of a 1990 IEEE publication "1990 Symposium on VLSI Technology".

An EEPROM, such as an EEPROM using NAND-structured memory cells as described above, has a mode of operation which simultaneously erases blocks of memory cells within the memory cell array, to provide a "flash memory". Typically, in portable or other information processing systems, application software is programmed into the flash memory. When an application is accessed, the application is generally downloaded and stored in a Dynamic Random Access Memory (DRAM) having a refresh mode. Then, the programmed operations of the application are executed. Recently developed flash memories which interface with a DRAM have a pin arrangement which is disclosed in a data book for the "28F016XD Flash Memory", published on October 1994 by Intel Corporation.

FIG. 1 illustrates a pinout configuration of the conventional DRAM interfaced flash memory. The flash memory in FIG. 1 employs an input/output bus having 16 L bit architecture, pins $\overline{RAS}$ and $\overline{CAS}$ as control signals for receiving a row address and a column address, and pins $\overline{RP}$, $\overline{WP}$ and RY/$\overline{BY}$ (R/$\overline{B}$) for operational modes of the flash memory. The $\overline{RP}$ pin places the flash memory into a "sleep" mode, so as to reduce power consumption during the standby state of the system. The $\overline{WP}$ pin prevents the loss of data stored in the memory upon power-up or down of the system, and the R/$\overline{B}$ pin is utilized to detect a time period of from several microseconds (μSec) to several milliseconds (mSec) required to program and erase the device.

Operations to read, program and erase of the flash memory having the pin-out arrangement as shown in FIG. 1 will now be described. A conventional DRAM generally has read and write modes determined by an alternative logic state of a write enable signal $\overline{WE}$. A logic "high" level of $\overline{WE}$ is for the read mode, and "low" is for the write mode. A flash memory can execute read, write, erase and program modes by applying appropriate command signals to the I/O bus (pins DQ0–DQ15 in FIG. 1). For example, as shown in the following Table 1, if the command signal "FFh" (FF hexadecimal) is applied to the I/O bus, the memory recognizes the command to execute a read operation and then performs the read operation. Similarly, hexadecimal signals "40h" and "20h" make the memory device operate in the write and erase modes, respectively.

TABLE 1

| MODE OF OPERATION | BUS SIGNAL STATE | | |
|---|---|---|---|
| | I/O BUS | ADDRESS | TIMING |
| READ | FFh | X | WRITE |
| WRITE | 40h | X | WRITE |
| ERASE | 20h | X | WRITE |
| PROGRAM | 0h | X | WRITE |

("X": = Don't care)

Referring to FIGS. 2A and 2B, an explanation of a typical read/write operation in the flash memory which receives the above commands is shown. FIG. 2A is a timing diagram illustrating the operation of the flash memory in the read mode. Where the command signal "FFh" is applied to the I/O pins of the flash memory, the address signals applied to the address pins A0 to A9 of FIG. 1 are ignored. When the column address strobe signal $\overline{CAS}$ and write enable signal $\overline{WP}$ transition to logic "low" levels in the interval where the row address strobe signal $\overline{RAS}$ is at the logic "low" level, and the data A5 applied to the I/O port of the memory is "FFh", the memory initiates the read mode of operation. Then, the read cycle where the read operation is performed has the same timing as that of the conventional DRAM. In other words, as shown in FIG. 2A, the memory recognizes the address input to the address line as row address A1, when $\overline{RAS}$ transitions to logic "low" level, and the memory recognizes the address input to the address line as column address A2, when the $\overline{RAS}$ is at the logic "low" level and the $\overline{CAS}$ transitions to logic "low" level. Accordingly, the memory outputs the stored data during the interval A4 through the I/O pins. When output of data is completed, the read cycle is terminated. A3 indicates an interval of a high impedance state for the I/O pins.

FIG. 2B is a timing diagram illustrating the operation of the flash memory in the write mode. The timing of FIG. 2B is similar to the read operation of FIG. 2A, but the command and write enable signals have logic states opposite to those of FIG. 2A. In the write mode, "40h" as command data A5 is applied during the command input cycle. When the command input cycle for the write mode of operation is completed, the memory waits for address and data to be received, and during the write cycle the memory executes the write operation of input data.

As described above, the write command for the flash memory is input under write timing, which is generally the same as that for a conventional DRAM. Accordingly, if a flash memory and DRAM use a common bus in a computer system, an undesired write operation may be performed in the DRAM. Moreover, for flash memory, both the write operation which transfers external data to an internal page buffer and the program operation which transfers the data stored in the internal page buffer to the flash memory cells, generally need to be performed. Accordingly, a command sequence to execute a program operation after a write operation is generally required.

For these and other reasons, flash memory and DRAM do not use a common bus within a computer system. A separate bus is provided, using separate commands for DRAM and flash memory. Since the central processing unit provides the commands individually, the performance of the whole system is degraded.

SUMMARY OF THE INVENTION

It is therefore an object of the invention to provide improved electrically erasable and programmable nonvolatile memory devices, and methods of operating the same.

It is another object of the present invention to provide electrically erasable and programmable nonvolatile memory devices which may be incorporated into systems which use dynamic random access memories without requiring substantial hardware or operational modifications.

These and other objects are provided, according to the present invention, by an electrically erasable and programmable nonvolatile memory device (EEPROM) which is pin-compatible with a dynamic random access memory device (DRAM), such that the electrically erasable and programmable nonvolatile memory device may be connected to a dynamic random access memory bus. Preferably, the device is also read and write timing compatible with dynamic random access memory read and write signals, and is also preferably block read and block write timing compatible with dynamic random access memory block read and block write signals. The device preferably accepts signals to perform sleep and erase functions from signal lines of a dynamic random access memory bus which are not used by a dynamic random access memory. In order to perform a block erase, the device preferably accepts an instruction to perform a block erase from signal lines of a dynamic random access memory bus which are not used by a dynamic random access memory, and a block address for the block erase from the most significant bit address lines of the dynamic random access memory bus. Accordingly, an electrically erasable and programmable nonvolatile memory may be made electrically and operationally compatible with a standard DRAM bus, and is thereby connectable thereto.

A preferred embodiment of an electrically erasable and programmable nonvolatile memory device according to the present invention includes an electrically erasable and programmable nonvolatile memory chip and a package which contains the chip. The package includes a plurality of pins which are adapted to electrically connect the chip to external devices. The plurality of pins includes a first group of pins and a second group of pins. The first group of pins provides memory functions which are common to a dynamic random access memory and an electrically erasable and programmable nonvolatile memory. Each pin in the first group is located on the package at a location of the corresponding pin of a dynamic random access memory. The second group of pins provides functions of an electrically erasable and programmable nonvolatile memory which are not common to a dynamic random access memory. Each pin in the second group is located on the package at a location of an unused pin of a dynamic random access memory. Examples of the common memory functions provided by the first group of pins include address, data, power supply, ground, read/write, row address strobe, column address strobe and output enable. Examples of unique memory functions provided by the second group of pins include sleep, busy, ready and block erase functions.

Preferably, the memory chip is responsive to conventional dynamic random access memory write and read data signal sequences to read and write, respectively. Similarly, the device is preferably responsive to standard dynamic random access memory block write and block read data signal sequences.

A preferred embodiment of an electrically erasable and programmable nonvolatile memory device according to the invention includes a buffer and a plurality of nonvolatile memory cells in the chip. The chip further comprises first means, responsive to a first sequence of signals on the first group of pins, to store data from the first group of pins into the buffer. The device also includes a restore mode which is implemented by second means, responsive to the first means, to store the data from the buffer into at least one selected nonvolatile memory cell, and third means responsive to one of the first and second means for placing a busy signal on at least one of the second pins to indicate that data is being stored from the buffer into the at least one selected nonvolatile memory cell.

The second means which stores the data from the buffer into the selected nonvolatile memory cells may perform the storing using one of three modes. In a "write match" mode, the data is not stored from the buffer into the nonvolatile memory cell if the data in the buffer already matches the data in the selected nonvolatile memory cell. In a "hit" mode, the device determines whether the selected nonvolatile memory cells are erased, and stores the data from the buffer in the erased nonvolatile memory cells. In a "write miss" mode, the selected nonvolatile memory cells are first erased and then the data is stored from the buffer into the selected nonvolatile memory cells if it has been determined that the selected nonvolatile memory cells are not erased.

A device according to the present invention also preferably includes a block erase function to provide a flash memory. During block erase, the chip is responsive to a signal on at least one of the second group of pins and to at least one most significant address bit in the first group of pins, to perform a block erase of at least one nonvolatile memory block identified by the at least one most significant address bit.

Methods of operating an electrically erasable and programmable nonvolatile memory, according to the present invention, send standard dynamic random access memory read instructions to the electrically erasable and programmable nonvolatile memory, to thereby read data therefrom, and send standard dynamic random access memory write instructions to the electrically erasable and programmable nonvolatile memory to thereby write data thereto. The instructions are preferably sent over a standard dynamic random access memory bus.

An electrically erasable and programmable nonvolatile memory and a dynamic random access memory may be operated, according to the present invention, by electrically connecting both the electrically erasable and programmable nonvolatile memory and the dynamic random access memory to a standard dynamic random access memory bus. Instructions are transmitted to the dynamic random access memory over the standard dynamic random access memory bus, without accessing the electrically erasable and programmable nonvolatile memory. Instructions are also transmitted to the electrically erasable and programmable nonvolatile memory over the standard dynamic random access memory bus without accessing the dynamic random access memory. improved integration of electrically erasable and programmable nonvolatile memories, including flash memories, into computer systems which use standard dynamic random access memories, is thereby provided.

BRIEF DESCRIPTION OF THE DRAWINGS

FIG. 1 illustrates a pin arrangement of a conventional DRAM-interfaced flash memory;

DETAILED DESCRIPTION OF PREFERRED EMBODIMENTS

Figure 2A:
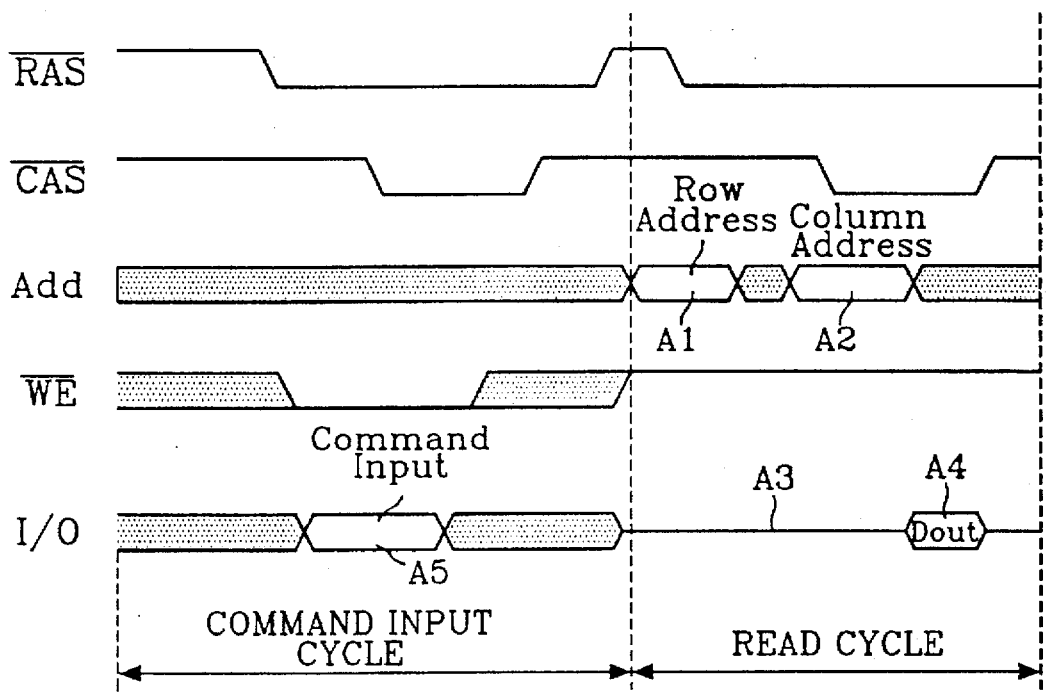
FIGS. 2A and 2B are timing diagrams illustrating the read and write operations of the flash memory of FIG. 1.
Figure 2B:
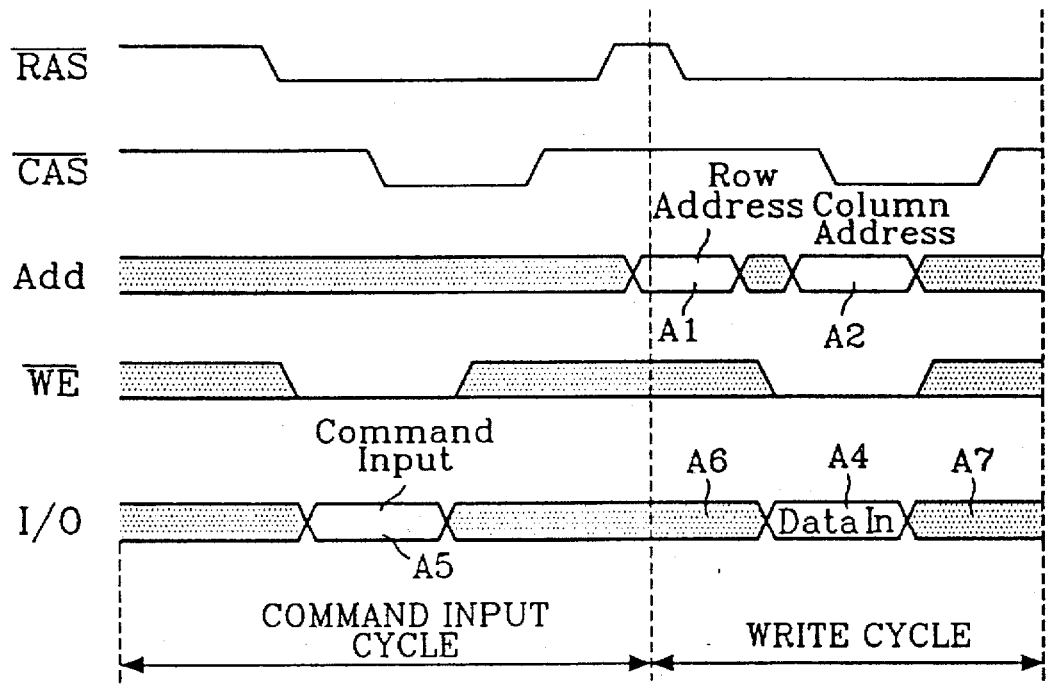

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Moreover, in the following description, numerous specific details are set forth, such as a specific embodiment of a memory device, or pin arrangement, in order to provide a thorough understanding of the present invention. For example, in the following description a 16 megabyte flash memory is described. It will be understood, however, by those skilled in the art that these specific details need not be employed to practice the present invention.

The present invention provides pin arrangements, structures and methods for an electrically erasable and programmable nonvolatile semiconductor memory (EEPROM) which can include a block erase function ("flash memory"), and which can be directly connected to a dynamic random access memory (DRAM) bus coupled between a microprocessor or central processing unit and a conventional DRAM. Different memory devices may be operated at the same time or individually, when the flash memory is connected with the DRAM on a common bus. Moreover, the operational timing of the flash memory requires minimal changes to the controller which supports the flash memory and the DRAM. Accordingly, in a system which downloads application software stored in a hard disk to a DRAM and executes the stored program, minimal alteration of the hardware is required to add flash memory. The flash memory is directly connectable to the same bus as the DRAM. Read and write operations may be conducted by selectively accessing the DRAM and flash memory, without impacting the operation of DRAM resident on the same bus during flash memory operation.

Although a flash memory of the present invention has the same package and pin arrangement as DRAM, data stored in the flash memory can be erased using a pin not used by the DRAM as a control pin, thereby reducing the restoring time period implemented after the write operation.

The present invention provides an EEPROM such as a flash memory, which multiplexes address signals as row and column address strobe signals which are received on a data bus, to thereby apply the address signals to address pins and execute a predetermined operation. The flash memory arranges the pins common to the external pins of a DRAM, in the same manner as the DRAM, and arranges a reset pin, ready/busy pin, and erase control pin which are necessary for specific operations of the flash memory, to correspond with pins not used for the DRAM.

Accordingly, the flash memory performs the same read operation for the data stored therein as a DRAM, without requiring additional command input, and performs the same write operation as a DRAM, without requiring additional command input. The flash memory operation includes a restoring interval wherein data applied through input/output pins is automatically written to the memory cells, when the row address strobe signal is changed to a first state (a logic "high" state). The flash memory also performs an erase operation for part or all data stored in the memory irrespective of the operation of DRAM in response to a data erase signal applied to the erase control pin.

In the restoring interval, one of the following three operational modes are performed in accordance with the states of information stored in a selected cell and information input from external to the cell: In a first operational mode, referred to as a write hit operation, all cells connected to selected word lines are in an erased state. Accordingly, in the restoring interval, only the program operation is executed without an erase operation. In the second operational mode, referred to as a write miss operation, none of the cells connected to selected word lines are in an erased state. Accordingly, the erase operation is automatically executed and the program operation is then automatically executed. In the third operational mode, referred to as a write match operation, data (byte, word, or an entire page) in the selected cells coincides with data which is input from external to the cell. In this case, in the restoring interval neither erase operation nor program operation is executed and the RY/$\overline{BY}$ is changed to the logic "high" state. The write match operation is generally executed prior to the write hit or write miss operations.

Figure 3:
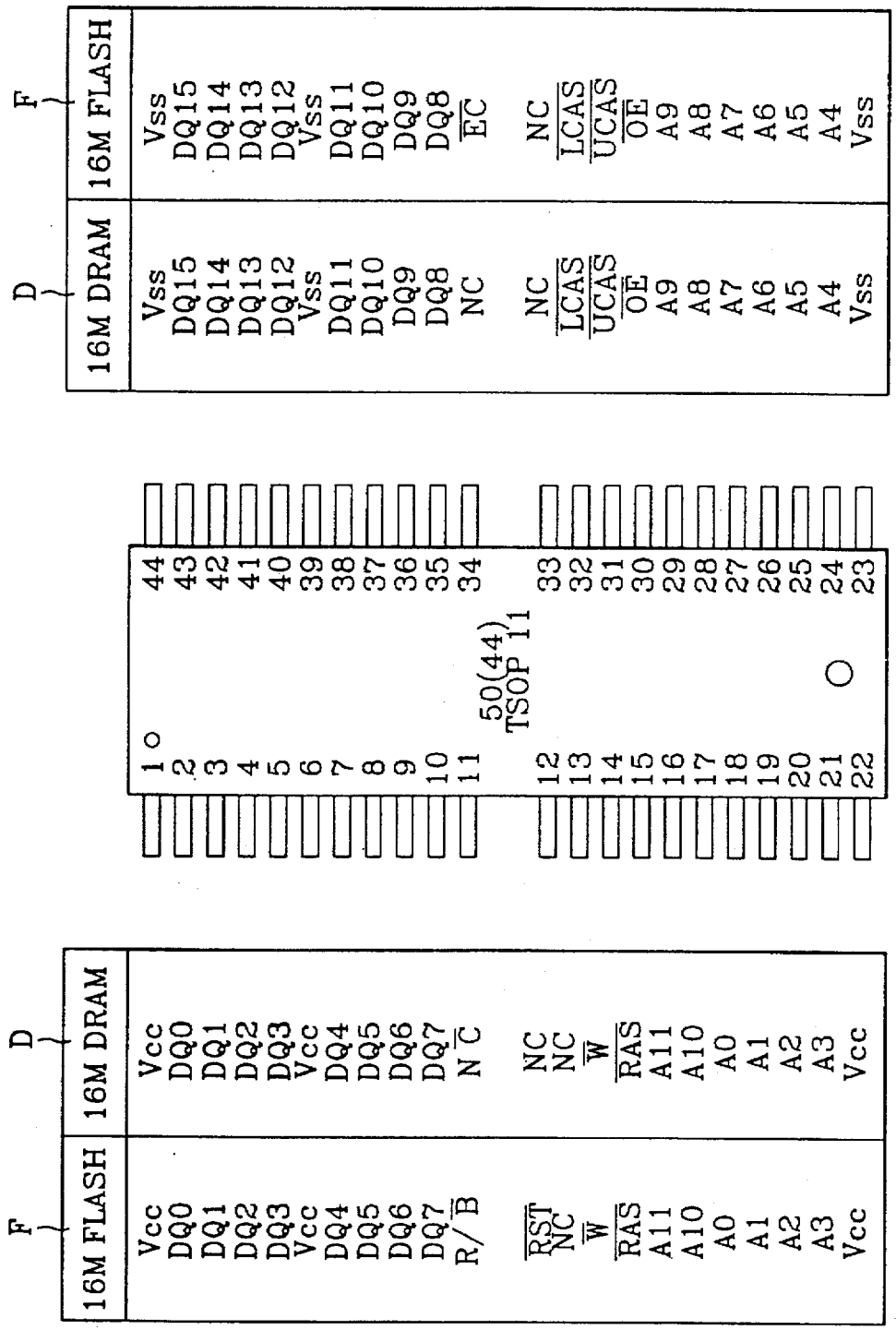
FIG. 3 illustrates a pin arrangement of a flash memory constructed according to the present invention, compared with that of a DRAM.

FIG. 3 illustrates a pin arrangement of a flash memory according to the present invention, which is compared with that of 16-megabyte DRAM 4K refresh 1M ×16 TSOP package product. Referring to FIG. 3, both memory devices (DRAM and flash memory) include a first group of pins which provide memory operations which are common to a DRAM and a flash memory. They include sixteen I/O pins (DQ0–DQ15), three pins for receiving control signals $\overline{RAS0}$ and $\overline{CAS}$ for dividing row/column addresses and $\overline{WE}$ for designating read or write modes, twelve address bus pins (A0–A11) for receiving address signals at twelve address lines, three power supply voltage pins Vcc, three ground voltage pins Vss, and one out enable pin $\overline{OE}$. Accordingly, 39 pins among the 44 pins shown in FIG. 3 are arranged commonly in the DRAM and the flash memory, through which the CPU transmits signals and data therebetween.

In order not to impact the operation of DRAM while operating mode flash memory, at least five function pins included only in the flash memory are provided. However, in the present invention, two pins in the five function pins are non-connection pins, and the remaining three pins form a second group of pins which are used for the operation of only the flash memory. These three pins are arranged to correspond with non-connection pins in the DRAM so that the flash memory can be placed on the same DRAM bus. That is, three function pins are provided, such as a reset pin $\overline{RST}$ located at the twelfth pin (NC) in the DRAM, a ready/busy pin R/$\overline{B}$ located at the eleventh pin (N/$\overline{C}$) in the DRAM, and an erase pin $\overline{EC}$ located at the thirty-fourth pin (NC) in the DRAM.

The reset pin $\overline{RST}$ resets the flash memory from various modes and places the flash memory into sleep mode, thereby reducing the power consumption to about 5 µA. The ready/busy pin R/$\overline{B}$ indicates a busy state of the flash memory, during a restoring operation which occurs over a period of several µSec to several mSec after a write operation, and to indicate the ready state by changing its logic level upon completion of restoring operation. The erase pin $\overline{EC}$ transmits the signal for the erase mode of operation to the flash memory. As is well known, a block erase operation is used to erase data of several kilobytes in the flash memory. In order to perform a block erase, the CPU applies the erase data through the bus line of the $\overline{EC}$ and the flash memory is placed in the erase mode of operation.

It can be seen from Table 2 below that the flash memory operation modes will not impact the DRAM. In particular, when the three pins for the flash operation on the DRAM bus are floating, the flash memory makes the three pins at the logic "high" or "low" state and therefore has no effect on another operation executed without the three pins.

TABLE 2

| Flash Operation Mode | $\overline{RAS}$ | $\overline{CAS}$ | $\overline{WE}$ | $\overline{OE}$ | $\overline{EC}$ | Data | DRAM Operation Mode |
|---|---|---|---|---|---|---|---|
| Standby | H | H | H | H | X | — | Standby |
| Read | L | L | H | L | H | Dout | Read |
| Write | L | L | L | X | H | Din | Write |
| Block Erase | L | H | H | X | L | Hi-z | RAS Only Refresh |
| WCBR (Flash Mode Advancement) | L | L | L | X | X | Hi-z | WCBR (Test Mode Advancement) |

Table 2 shows the operational modes of a flash memory according to the present invention and a general DRAM in accordance with the logic state of each pin. During the read mode of operation, at the state where the above signals are all at logic "low" state, data corresponding to the selected address is output from the memory, when the $\overline{RAS}$ and $\overline{CAS}$ transition to logic "low" state and the becomes a logic "high". When the $\overline{RAS}$ and $\overline{CAS}$ all become logic "low" and $\overline{WE}$ becomes logic "low", the write mode of operation is executed and data is stored in the designated address. Conventionally, the read and write operations are executed after the input of the command, but the DRAM and the flash memory of FIG. 3 can execute the read and write operations without the command input cycle under the same timing as each other.

The flash memory executes a block erase operation when the $\overline{RAS}$ and $\overline{EC}$ pins become logic "low" and the $\overline{CAS}$ pin changes to logic "high". In this case, the DRAM executes RAS only refresh mode of operation as well known in the art. Furthermore, when the $\overline{WE}$ pin changes to logic "high", the $\overline{CAS}$ changes to the logic "low" and the $\overline{RAS}$ then becomes logic "low", the DRAM advances to the CAS before RAS refresh mode of operation, but the timing in the flash memory is not affected because the flash memory does not require a refresh operation.

The remaining operational modes of a flash memory are implemented using logic state combinations which are not used by a DRAM. For example, the flash memory mode for designating lock/unlock blocks to prevent erase and reprogram by reading the device and manufacture information, or by selecting a specific block, are selected using modes not used in the DRAM. In particular, before the $\overline{RAS}$ changes from the logic "high" state to the logic "low" state, a WCBR mode of operation can be used, where the $\overline{CAS}$ and $\overline{WE}$ change from logic "high" to logic "low".

The WCBR mode of operation is well known as a test mode in DRAM. It will be described in detail in FIG. 10, but will now be described in general. When address key data is input in the WCBR mode, a DRAM uses the address starting from least significant bits LSB. In contrast, a flash memory according to the present invention uses address starting from the most significant bits MSB. Thus, the operation of the DRAM is ignored upon selection of flash mode, and the operation of the flash memory is ignored upon the selection of DRAM mode.

Accordingly, a flash memory having pin arrangement including $\overline{EC}$ for selecting the block erasure as shown in FIG. 3, can perform the same read/write operation as those of DRAM, in a system using DRAM and flash memory on the same bus. Hence, a user can use the flash memory without the changing the hardware board within the system.

Figure 4A:
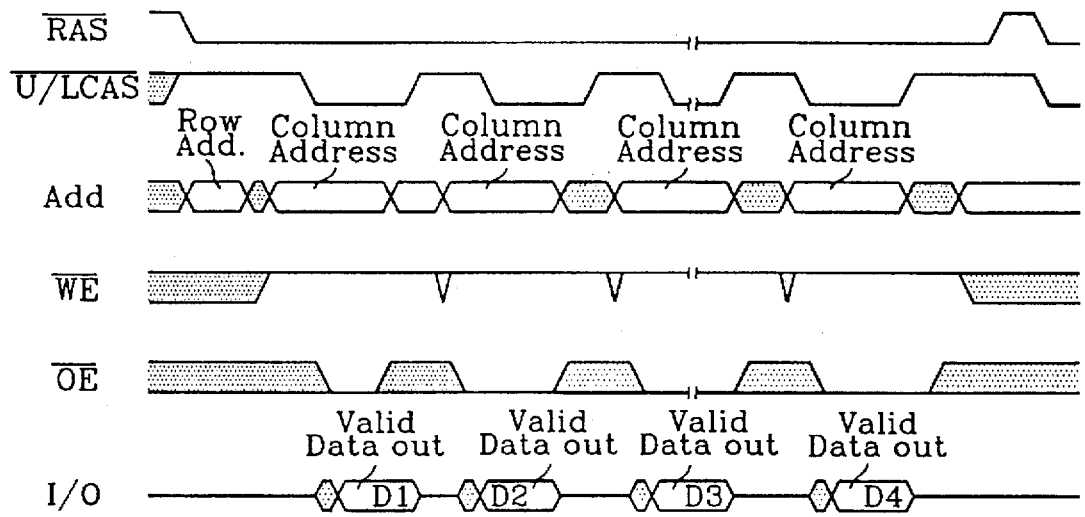
FIGS. 4A and 4B are timing diagrams illustrating read and write operations of a flash memory constructed according to the present invention.
Figure 4B:
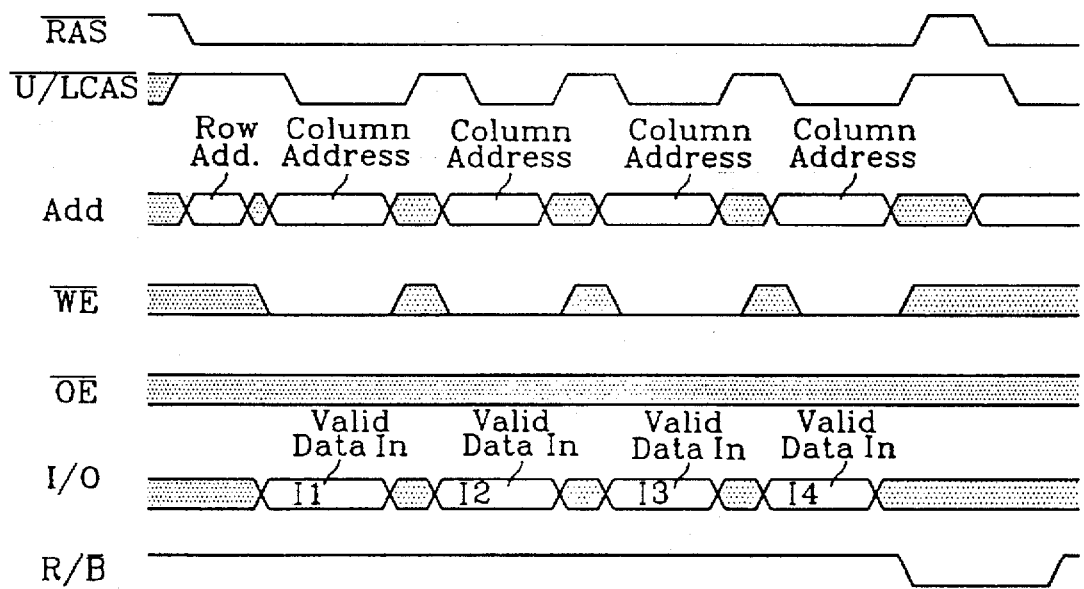

FIGS. 4A and 4B are timing diagrams illustrating a fast page mode read timing and a fast page mode write timing, respectively, of the flash memory. The timing of the fast page read mode of operation is the same as that of 16-megabyte DRAM. The timing of the fast page write mode of operation is similar to that of the 16-megabyte DRAM, but is different therefrom because the R/$\overline{B}$ pin indicating the operation state of the flash memory falls to logic "low" level, after all of the data is written and the $\overline{RAS}$ then goes to the logic "high" level. This timing indicates the busy state during which data currently input is being programmed within the cell of the flash memory.

In particular, in order to change the data of the flash memory from logic "1" to "0", the memory cell transistor must generate a tunneling operation by a hot electron or Fowler-Nordheim current, the duration of which may range from several µ to several mSec. The flash memory outputs the busy signal through the R/$\overline{B}$ pin so that the CPU of the system can recognize the busy state. After the data within the flash memory is written, the CPU of the system, which performs a next operation in the restoring interval of the busy state, may enter a wait cycle until the busy state is changed to the ready state. The time period of the restoring interval is determined based upon the above-mentioned "write hit", "write miss" and "write match" modes according to the data stored cells connected to the selected row line and the data newly input from the outside of the system. An explanation of the read, write and restoring operations will be given with reference to FIGS. 5 through 9.

Figure 5:
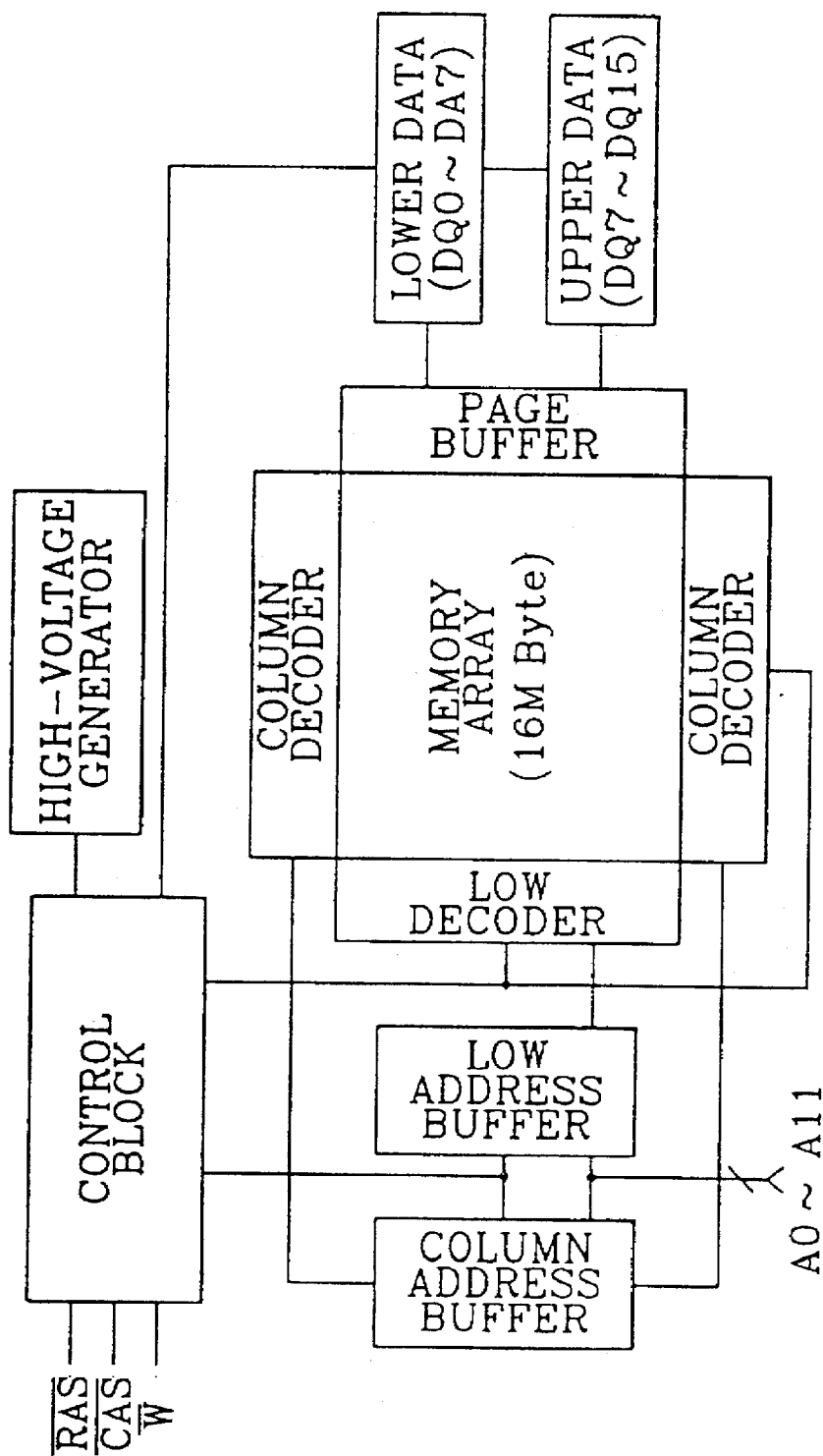
FIG. 5 is a block diagram illustrating a configuration of a flash memory constructed according to the principles of the present invention.

FIG. 5 is a block diagram illustrating the configuration of the flash memory constructed according to the principles of the present invention. The description of the function of each block is not necessary because it has the same function as a DRAM or flash EEPROM.

Figure 6:
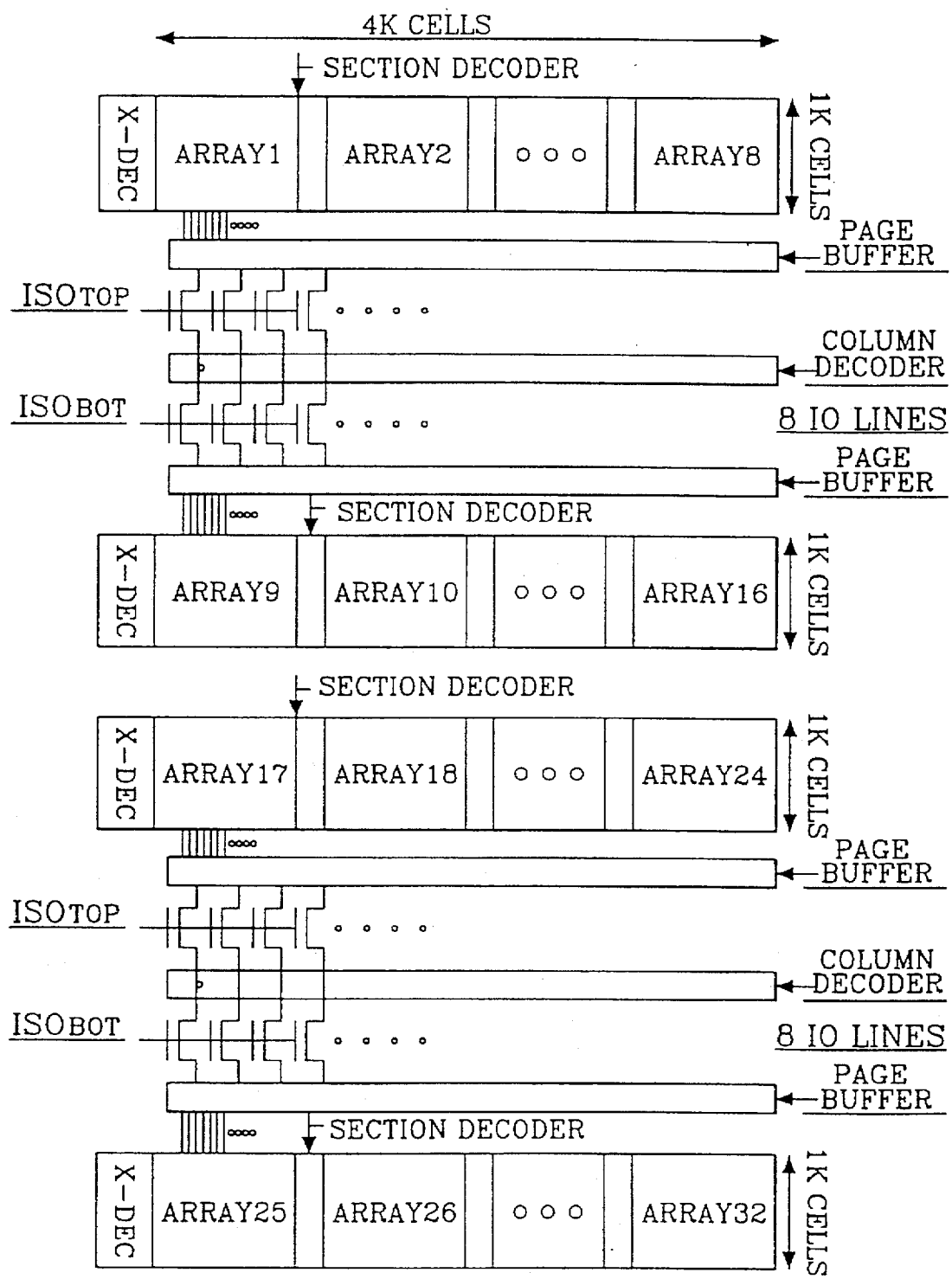
FIG. 6 is a circuit diagram illustrating a connection between a memory array and blocks associated therewith according to an embodiment of the present invention.

FIG. 6 is a circuit diagram illustrating a connection between the memory array of FIG. 5 and blocks associated therewith. It will be understood that in FIG. 6, 1M * 16 bit (16 Mbit) structure is illustrated, but other configurations may be used. For the convenience of explanation, the cell arrays are divided into 32 blocks. Moreover, in FIG. 6 the cell arrays are NAND structured flash-EEPROM, but another type of nonvolatile memory cell can be used. A NAND cell array structure and a decoder circuit are disclosed in Korean Patent Application No. 1993-390 entitled "Nonvolatile semiconductor memory device" filed by the assignee of the present invention.

In FIG. 6, two of four mats, each comprised of eight cell arrays, operate simultaneously during the read and write operations. However, the present invention is independent of the number of mats operating simultaneously. Moreover, in FIG. 6, an embodiment where two bit lines are connected to a single page buffer is shown, but a single bit line or a plurality of bit lines may be connected thereto.

Figure 7A:
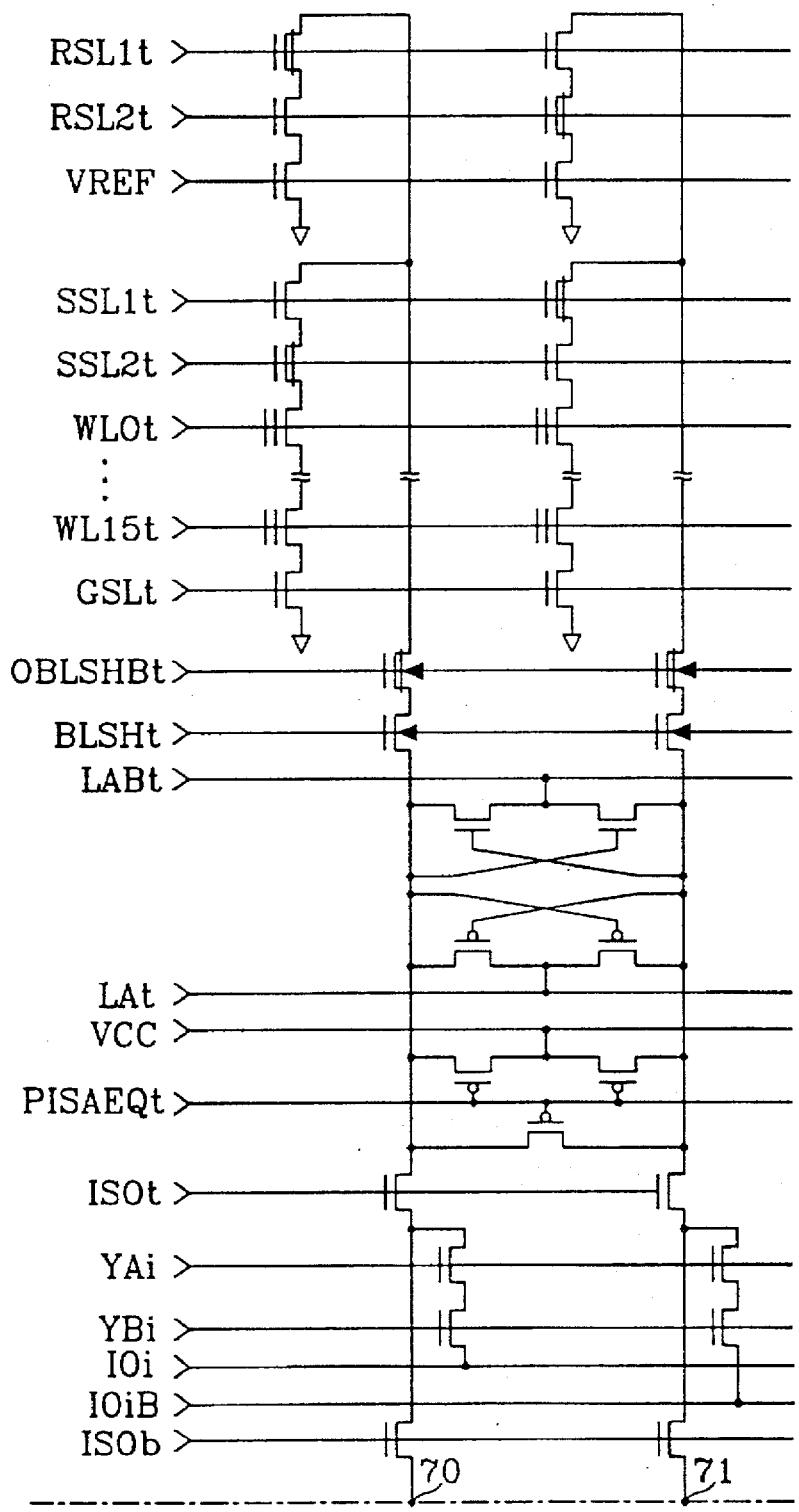
FIGS. 7A and 7B are detailed circuit diagrams illustrating a portion of the memory array and page buffer of FIG. 6.
Figure 7B:
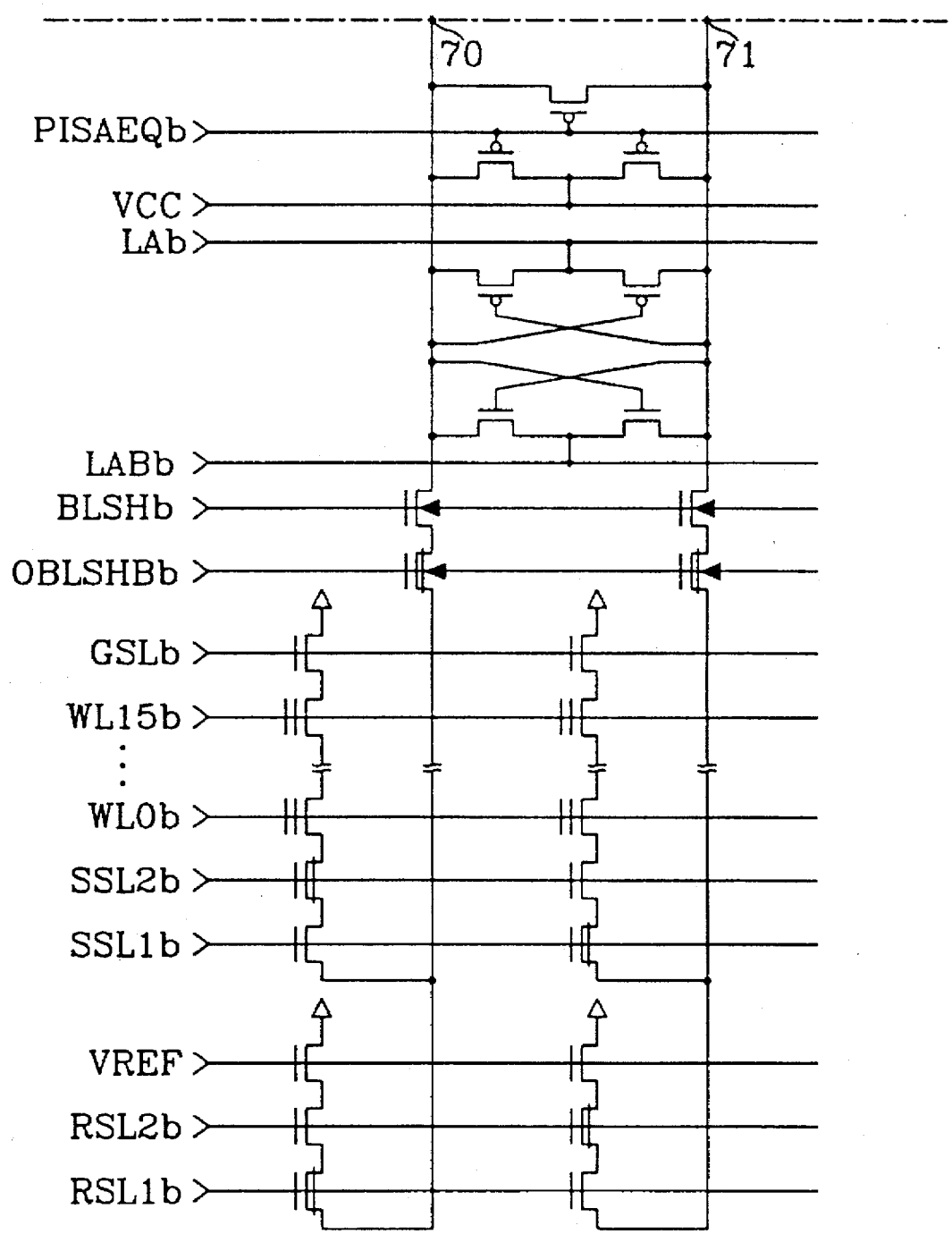

FIGS. 7A and 7B, which together form FIG. 7, are detailed circuit diagrams illustrating a portion of the memory array and page buffer of FIG. 6, in which two bit lines are connected to the single page buffer. A read operation of the circuit shown in FIG. 7 will be discussed with reference to FIG. 4. In FIG. 4, when $\overline{RAS}$ falls to the logic "low" level and the row address for selecting the word line is input through the address pin, a single word line is selected on one mat by the designation of the row address. Accordingly, in FIG. 7, one of the two bit lines connected to the single page buffer is selected and the other is unselected. At this time, reference cells connected to the unselected bit line produce current to lower the potential of the unselected bit line below a precharge voltage thereof.

The potential of the selected bit line depends on whether the cells selected by the selected word line among the cells connected to the selected bit line are to be erased or programmed. That is, when the cells are erased, the potential of the selected bit line is much lower than that of the unselected bit line. When the cells are programmed, the potential of the selected bit line is much higher than that of the unselected bit line, since the cells have no path through which current can flow.

The selection and unselection of the bit line are dependent upon the signals RSL1t, RSL2t, SSL1t and SSL2t in FIG. 7. When RSL1t and SSL1t are at the logic "high" level and the RSL2t and SSL2t are at the logic "low" level, the left bit line becomes the unselected bit line. At this time, the reference cell is turned on and the amount of current for the reference cell is determined by a voltage VREF. Conversely, the right bit line becomes the selected bit line. At this time, the reference cell is turned off and the amount of current for the reference cell is determined by the state of the selected cell. If there is a difference between the potentials of the selected and unselected bit lines, a latch type sense amplifier is activated, (i.e., LABt is activated at the logic "low" level and the LAt is activated at the logic "high" level). Thus, a small voltage difference therebetween is amplified to the level difference between 0 V and a power supply voltage Vcc. The amplified difference allows the IOi and IOiB to be at the logic "low" level and the YAi and YBi to be at the logic "high" level. A data voltage thereby appears at the bit line. When the data IOi and IOiB are output through a DQ driver, the read operation is complete. FIG. 7B shows the page buffer corresponding to the mat not activated in FIG. 6.

A write operation will now be described. If the external data in FIG. 4 is to be written, the $\overline{RAS}$ is changed to the logic "low" level and the input address is determined by the row address. As a result, the word line to be written is selected, and $\overline{WE}$ is changed to the logic "low" level after a lapse of a predetermined time, so that the memory can sense the initiation of a write operation. At this time, the data to be written is input via the DQ pins. The data input from the exterior is written in the page buffer of the unselected mat, for example, the latch portion of the page buffer of FIG. 7B. Here, the signals LAb and LABb are at logic "high" and "low" levels, respectively. When $\overline{RAS}$ is changed to logic "high" level after the completion of the write operation, the write operation from the exterior is complete, and a restoring operation begins to write the latched data in the interior of the device onto the memory cells. When R/$\overline{B}$ changes to logic "low" level, it prevents access of the memory by exterior device. The internal write operation in the memory, i.e., the restoring operation, is performed in the manner described for the reading operation, by reading data of the cell connected to the word line selected in the page buffer of the selected mat after the data input from the exterior already exists in the page buffer of the unselected mat. When the reading operation is completed, a comparison between the data of the page buffers of the selected mat and unselected mat is made, and it is further determined whether the data of the selected mat is the data corresponding to the cells which have been erased. The comparison of the data is typically executed by a comparator circuit. Moreover, the above determination is made in accordance with the addition of data (OR-gating) of all of the cells in the selected mat is the logic "0" or "1", since the data of the page buffer corresponding to the cells which have been erased is "0" (the logic "low" level). In a write match operation, when the data of the page buffers of the selected mat and unselected mat are equal to each other, the write operation is completed and R/$\overline{B}$ goes to the logic "high" level. Then, after a lapse of a constant time period, the stand-by state is maintained.

When the data of the page buffers of the selected mat and unselected mat are determined not to match, the data of the page buffer of the selected mat are all the "0", i.e., all cells are erased, the data of the unselected mat is transmitted to the page buffer of the selected mat. This is referred to as a write hit operation. Transmission is achieved after the page buffers of FIG. 7A are equalized, by maintaining LABt and LAt at the logic "low" and "high" levels, respectively, and changing the ISOt and ISOb to the logic "high" level while the LABb and LAb are in the logic "low" and "high" levels, respectively. After the data transmission, the data of page buffer of the selected mat is programmed as disclosed in the aforesaid Korean Patent Application. After completion of the program operation, the R/$\overline{B}$ goes to the logic "high" level, the stand-by state for the completion of the write operation is maintained.

On the other hand, when no data of the page buffer of the selected mat is at "0", the latches of page buffer of the selected mat are equalized, and the data of the unselected mat is stored in the page buffer of the selected mat. This corresponds to a write miss operation. An erase operation is performed for all of the cells connected to the selected word line of the selected mat. After completion of the erase operation, the data of the page buffer of the selected mat is written to the unselected bit line of the selected mat, and the data of page buffer of the unselected mat is transmitted to the page buffer of the selected mat. After completion of the transmission operation, the data of the page buffer of the selected mat is written to the selected bit line. Then, the R/

$\overline{B}$ changes to logic "high" level, and after a lapse of a predetermined time, the stand-by state is maintained to execute the next operation.

Accordingly, when the write data from outside the chip is stored in the page buffer of the selected mat, the data in the page buffer of the selected mat is first transmitted to the page buffer of the unselected mat. The above operations are then executed depending upon whether a write match, write hit and write miss occurs.

Figure 8:
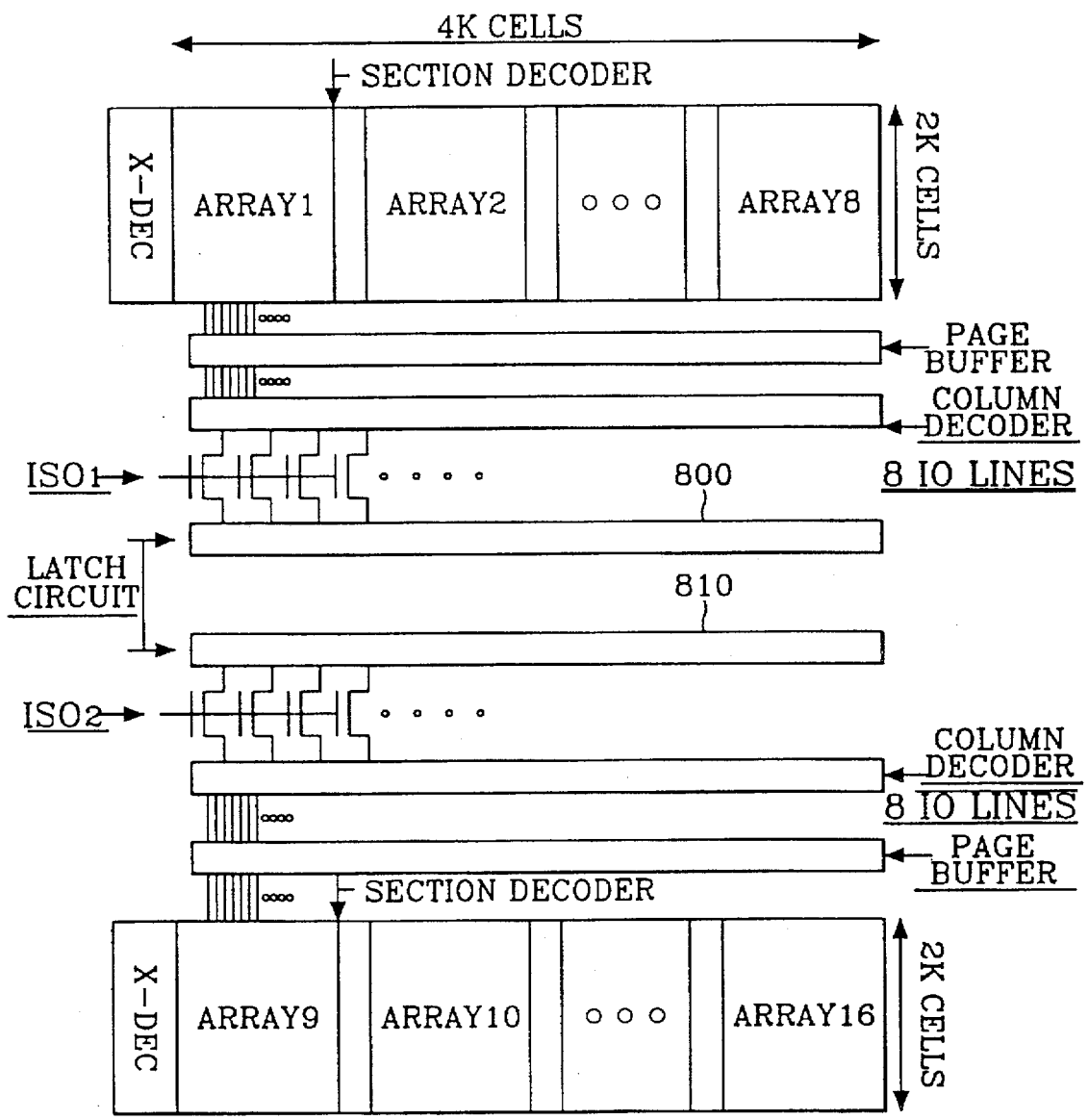
FIG. 8 is a circuit diagram illustrating a connection between the memory array and blocks associated therewith according to an embodiment of the present invention.
Figure 9:
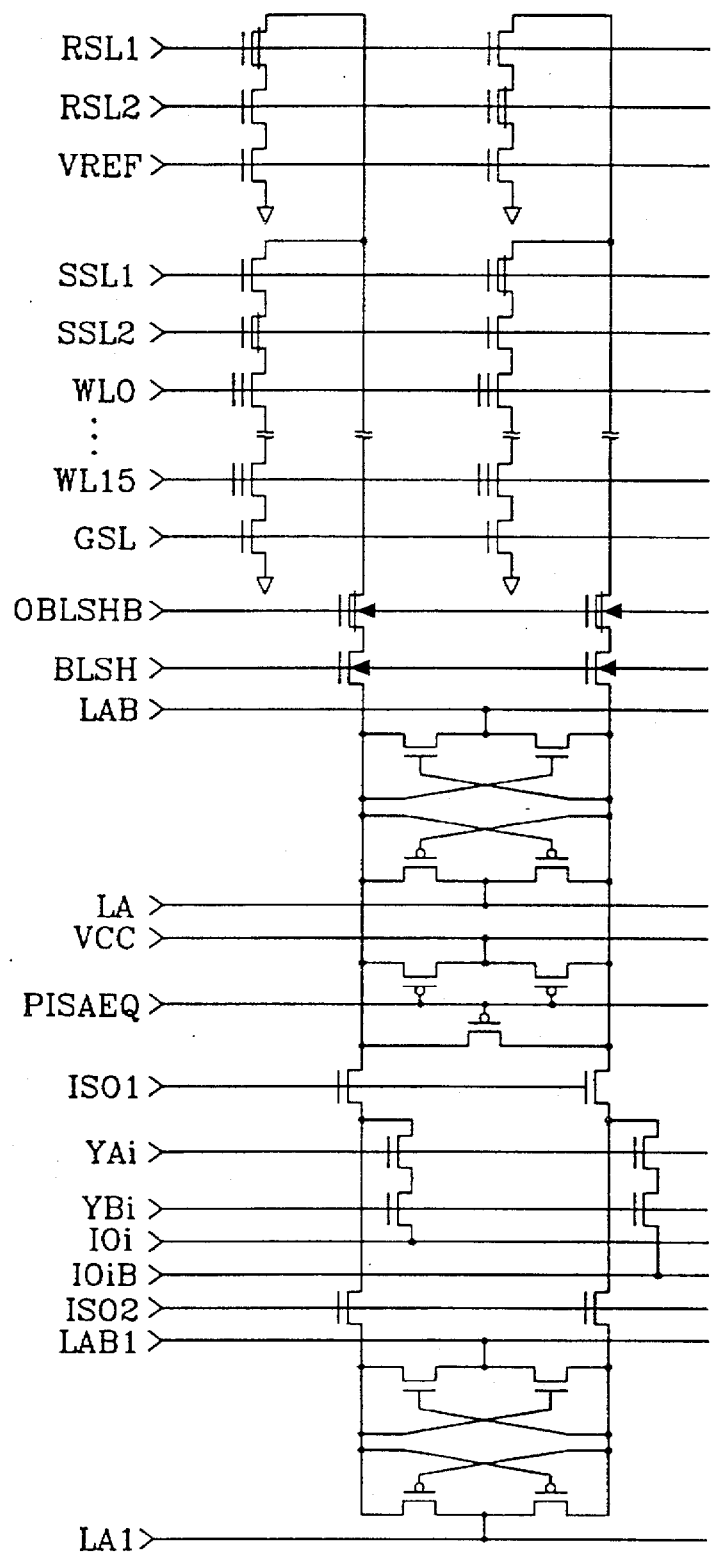
FIG. 9 is a detailed circuit diagram illustrating a portion of the memory array and page buffer of FIG. 8.

FIG. 8 is a circuit diagram illustrating a connection between the memory array and blocks associated therewith according to an embodiment of the present invention. FIG. 9 is a detailed circuit diagram illustrating the portion of the memory array and page buffer of FIG. 8.

Referring to FIG. 8, two mats in the memory are simultaneously selected and one word line in each mat is selected. Here, the read and write operations are performed in a similar fashion to those of FIGS. 6 and 7. One difference is that the function of the page buffer of the unselected mat of FIG. 6 is executed by latch circuits 800 and 810 of FIG. 8.

In a data read operation, the data of the selected bit line is stored in the page buffer when the ISO1 and ISO2 are at the logic "low" level. After the ISO1, YAi and YBi change to the logic "high" level, the data of the page buffer is output to the exterior through lines IO1 and IOiB. In a data write operation, the input data from the exterior is stored in the latch circuits 800 and 810 through the lines IO1 and IOiB when ISO1 is in the logic "low" level and ISO2 is in the logic "high" level. After that, the data of the selected bit line is stored in the page buffer in the same manner as the data read operation. The appropriate write match, write hit and write miss operation is performed as discussed hereinbefore to thereby complete the write operation.

Figure 10:
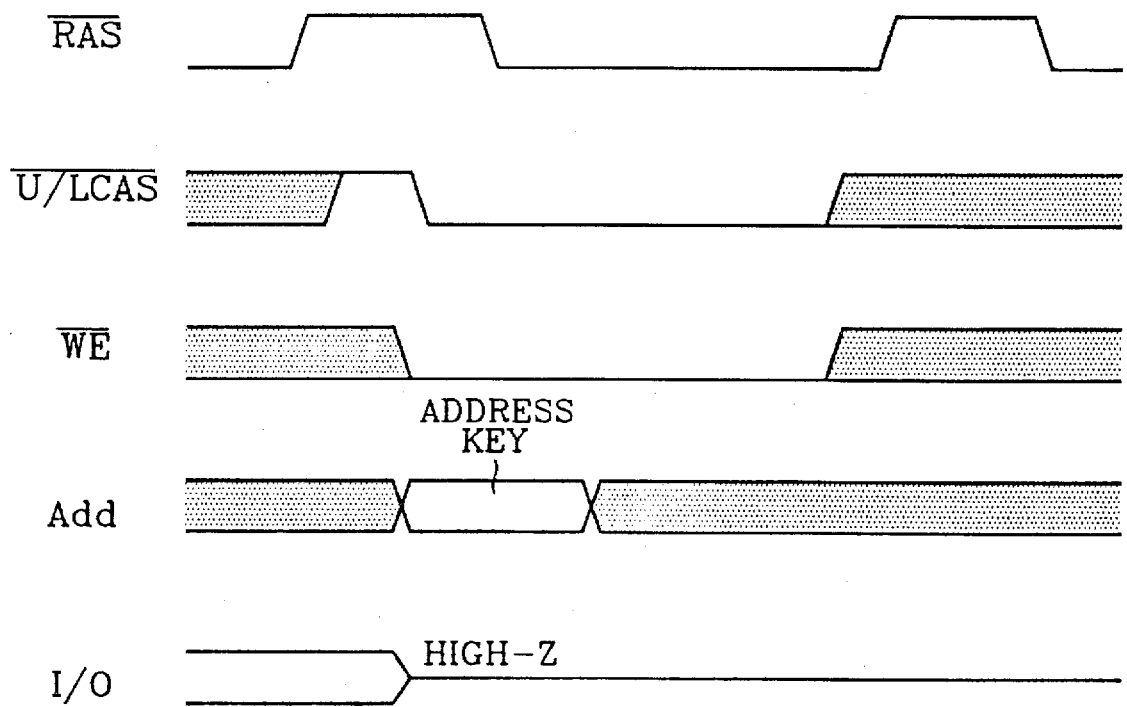
FIG. 10 is a timing diagram illustrating an operation mode setting of the flash memory of FIG. 3 by an address combination signal according to the present invention.

FIG. 10 is a timing diagram illustrating erase suspend, lock/unlock block and device ID read modes which may be required only in a flash memory. One embodiment of an address key for the flash operation modes is illustrated by the following Table 3:

TABLE 3

| Function | A11 | A10 | A9 | A8-A0 | Timing |
| --- | --- | --- | --- | --- | --- |
| Read Status Register | 1 | 0 | 0 | Not Used | WCBR |
| Lock Block | 0 | 1 | 0 | | |
| Unlock Block | 1 | 0 | 1 | | |
| ID Read | 1 | 1 | 0 | | |
| Page Erase Mode | 0 | 1 | 1 | | |

FIG. 10 illustrates the WCBR timing where the CPU applies address key data shown in Table 3 through the address pins of the flash memory. The applied address key data is stored in a register within the flash memory and functions to execute a predetermined mode of operation. In FIG. 10, before the $\overline{RAS}$ changes to the logic "low" level, the $\overline{CAS}$ and $\overline{WE}$ must be at logic "low" level. Then, when the $\overline{RAS}$ changes to the logic "low" level, any one of the flash modes are selected according to the address input. The WCBR timing is commonly used in designating a test mode in a DRAM, and the DRAM uses addresses starting from least significant bits (LSB). However, the flash memory uses 3-bits from most significant bits (MSB) so as to select a particular flash mode. In a system where DRAM and flash memory are operated on the same bus line, the operation of a flash memory can be performed without impacting the operation of DRAM. Since the detailed operation of a DRAM is well known, further description will be omitted for brevity.

Therefore, in a system wherein a DRAM and a DRAM interface flash memory are operated on the same bus line, the operation modes for the read and write are commonly used, and in the flash mode only the flash memory can be accessed by using the WCBR timing or the $\overline{EC}$, independent of the DRAM operation. Moreover, a data erase mode can be provided to the flash memory by using a hardware pin control on the same bus line, so that the flash memory can be controlled by arranging a control pin, without significantly changing the existing DRAM control chip set.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An electrically erasable and programmable nonvolatile memory device comprising:

an electrically erasable and programmable nonvolatile memory chip; and a package which contains the chip, the package including a plurality of pins which are adapted to electrically connect the chip to external devices, the plurality of pins including a first group of pins and a second group of pins;

the first group of pins providing memory functions which are common to a dynamic random access memory and an electrically erasable and programmable nonvolatile memory, each pin in the first group being located on said package at a location of a corresponding pin of a dynamic random access memory; and the second group of pins providing functions of an electrically erasable and programmable nonvolatile memory which are not common to a dynamic random access memory, each pin in the second group being located on said package at a location of an unused pin of a dynamic random access memory.

2. A device according to claim 1 wherein said first group of pins provide memory functions including address, data, power supply, ground, read/write, row address strobe, column address strobe, and output enable and wherein said second group of pins provide functions including sleep, busy/ready and block erase.

3. A device according to claim 1 wherein said memory chip is responsive to a first sequence of signals on said first group of pins to write data and to a second sequence of signals on said first group of pins to read data, and wherein said first and second sequences of signals are identical to dynamic random access memory write and read data signal sequences, respectively.

4. A device according to claim 3 wherein said memory chip is responsive to a third sequence of signals on said first group of pins to write blocks of data and to a fourth sequence of signals on said first group of pins to read blocks of data, and wherein said third and fourth sequences of signals are identical to dynamic random access memory block write and block read data signal sequences, respectively.

5. A device according to claim 1 wherein said chip includes a buffer and a plurality of nonvolatile memory cells, said chip further comprising:

first means responsive to a first sequence of signals on said first group of pins to store data from said first group of pins into said buffer;

second means, responsive to said first means to store the data from said buffer into at least one selected nonvolatile memory cell; and third means, responsive to at least one of said first and second means, for placing a busy signal on at least one of said second pins to indicate that data is being stored from said buffer into said at least one selected nonvolatile memory cell.

6. A device according to claim 5 wherein said second means comprises:
   means for refraining from storing the data from said buffer into said at least one selected nonvolatile memory cell if the data in said buffer matches the data in said at least one selected nonvolatile memory cell.

7. A device according to claim 6 wherein said second means further comprises:
   means for determining whether said at least one selected nonvolatile memory cell is erased;
   means, responsive to said determining means, for storing the data from said buffer in said at least one selected nonvolatile memory cell if said at least one selected nonvolatile memory cell is erased; and
   means, responsive to said determining means, for erasing said at least one selected nonvolatile memory cell and for storing the data from said buffer in said at least one selected nonvolatile memory cell if said at least one selected nonvolatile memory cell is not erased.

8. A device according to claim 1 wherein one of said memory functions of an electrically erasable and programmable nonvolatile memory which are not common to a dynamic random access memory is a block erase function, and wherein said chip is responsive to a signal on at least one of said second group of pins and to at least one most significant address bit in said first group of pins, to perform a block erase of at least one nonvolatile memory block identified by said at least one most significant address bit.

9. An electrically erasable and programmable nonvolatile memory integrated circuit chip which is pin compatible with a dynamic random access memory integrated circuit chip such that the electrically erasable and programmable nonvolatile memory integrated circuit chip may be connected to a dynamic random access memory bus;
   which is also read and write timing compatible with dynamic random access memory integrated circuit chip read and write signals; and
   which is also block read and block write timing compatible with dynamic random access memory integrated circuit chip block read and block write signals.

10. An electrically erasable and programmable nonvolatile memory integrated circuit chip which is pin compatible with a dynamic random access memory, integrated circuit chip such that the electrically erasable and programmable nonvolatile memory integrated circuit chip may be connected to a dynamic random access memory bus;
    which is also read and write timing compatible with dynamic random access memory integrated circuit chip read and write signals; and
    which accepts signals to perform sleep and erase functions from signal lines of a dynamic random access memory bus which are not used by a dynamic random access memory integrated circuit chip.

11. An electrically erasable and programmable nonvolatile memory integrated circuit chip according to claim 10 which accepts an instruction to perform a block erase from signal lines of a dynamic random access memory bus which are not used by a dynamic random access memory integrated circuit chip, and a block address for the block erase from the most significant bit address lines of the dynamic random access memory bus.

12. A nonvolatile memory device which is responsive to a row address strobe signal and a column address strobe signal and having electrical erase and program functions, comprising:
   a plurality of pins commonly used with a dynamic random access memory and arranged at locations corresponding to said dynamic random access memory;
   a plurality of pins arranged at locations corresponding to unused pins of said dynamic random access memory for use with said nonvolatile memory, such that said device may be directly connected to buses for said dynamic random access memory in an electronic system without further modification;
   means for performing a read operation which is the same as that of said dynamic random access memory;
   means for performing a write operation which includes a restoration period wherein input data is written into memory cells in response to a transition of said row address strobe signal; and
   means for performing an erase operation independent of operations of said dynamic random access memory.

13. A nonvolatile memory device according to claim 12, wherein said write operation performing means comprises means for inputting data into a buffer which corresponds to each selected bit line in said device.

14. A nonvolatile memory device according to claim 12, wherein said write operation performing means comprises means for programming a cell transistor of said device with data stored in a buffer, during said restore period.

15. A nonvolatile memory device according to claim 12, wherein said pins include a reset pin, a ready/busy pin and an erase pin.

16. A nonvolatile memory device according to claim 15, wherein a signal on said reset pin places said device in a sleep mode so as to reduce a power consumption in said device, wherein a signal on said ready/busy pin indicates one of a busy state and a ready state, and wherein a signal on said erase pin transfers an address for said erase operation into said device.

17. A nonvolatile memory device according to claim 12, wherein said restore period includes a write match mode, a write hit mode and a write miss mode.

18. A nonvolatile memory device according to claim 17, wherein said write match mode is initiated when data to be written is the same as data stored in selected cells.

19. A nonvolatile memory device according to claim 17, wherein said write hit mode is initiated when all data stored in cells selected are erased.

20. A nonvolatile memory device according to claim 17, wherein said write miss mode is initiated when at least one of the selected cells is not erased.

21. A nonvolatile memory device according to claim 12, wherein said plurality of pins arranged at locations corresponding to unused pins of said dynamic random access memory for use with said nonvolatile memory include a reset pin, a ready/busy pin and an erase pin;
    said nonvolatile memory device further comprising means for performing a flash operation in response to an input of an address key through address pins in accordance with a specific timing.

22. A nonvolatile memory device according to claim 21, wherein said specific timing is a WCBR timing in which said row address strobe signal is changed to a second state, after said column address strobe signal and said write enable signal are changed from a first state to the second state.

23. A nonvolatile memory device according to claim 22, wherein said first state is a logic "high" state CMOS level, and said second state is a logic "low" state CMOS level.

24. A nonvolatile memory device according to claim 21, wherein said address key is provided through three pins including a pin for a most significant address bit among the address pins.

25. A nonvolatile memory device according to claim 21, wherein said means for performing a flash operation comprises means for performing at least one of an erase suspend operation, a lock/unlock block designation operation, and a memory identification read operation.

26. A method of operating an electrically erasable and programmable nonvolatile memory integrated circuit chip and a dynamic random access memory integrated circuit chip comprising the step of:

directly connecting both the electrically erasable and programmable nonvolatile memory integrated circuit chip and the dynamic random access memory integrated circuit chip to a standard dynamic random access memory bus.

27. A method according to claim 26 wherein said directly connecting step is followed by the step of transmitting instructions to said dynamic random access memory integrated circuit chip over said standard dynamic random access memory bus without accessing said electrically erasable and programmable nonvolatile memory integrated circuit chip.

28. A method according to claim 26 wherein said directly connecting step is followed by the step of transmitting instructions to said electrically erasable and programmable nonvolatile memory integrated circuit chip over said standard dynamic random access memory bus without accessing said dynamic random access memory integrated circuit chip.

* * * * *